United States Patent
Rupp et al.

(10) Patent No.: US 9,496,346 B2
(45) Date of Patent: *Nov. 15, 2016

(54) SILICON CARBIDE DEVICE AND A METHOD FOR FORMING A SILICON CARBIDE DEVICE

(71) Applicant: Infineon Technologies AG, Neubiberg (DE)

(72) Inventors: Roland Rupp, Lauf (DE); Christian Hecht, Buckenhof (DE); Jens Konrath, Villach (AT); Wolfgang Bergner, Klagenfurt (AT); Hans-Joachim Schulze, Taufkirchen (DE); Rudolf Elpelt, Erlangen (DE)

(73) Assignee: Infineon Technology AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/974,553

(22) Filed: Dec. 18, 2015

(65) Prior Publication Data

US 2016/0104779 A1  Apr. 14, 2016

Related U.S. Application Data

(63) Continuation of application No. 14/033,631, filed on Sep. 23, 2013, now Pat. No. 9,257,511, which is a continuation-in-part of application No. 13/850,374, filed on Mar. 26, 2013, now Pat. No. 9,035,322.

(51) Int. Cl.
*H01L 29/15* (2006.01)
*H01L 29/16* (2006.01)
(Continued)

(52) U.S. Cl.
CPC ......... *H01L 29/1608* (2013.01); *H01L 21/045* (2013.01); *H01L 21/046* (2013.01);
(Continued)

(58) Field of Classification Search
CPC . H01L 21/045; H01L 21/046; H01L 21/047; H01L 21/0495; H01L 21/02167; H01L 21/02378; H01L 21/02447; H01L 21/02529; H01L 21/0445; H01L 21/3148; H01L 29/1608; H01L 29/6606; H01L 29/66053
USPC .......................................................... 257/77
See application file for complete search history.

(56) References Cited

U.S. PATENT DOCUMENTS 5,322,802 A   6/1994 Baliga et al.
6,023,078 A   2/2000 Baliga
(Continued)

FOREIGN PATENT DOCUMENTS

JP  2012151354 A   8/2012
JP  2012235171 A   11/2012
(Continued)

OTHER PUBLICATIONS

U. Knipper, et al.; "Time-Periodic Avalanche Breakdown at the Edge Termination of Power Devices"; Proceedings of the 20th International Symposium on Power Semiconductor Devices and IC's; May 18-22, 2008, Orlando, Florida, p. 307-310.
(Continued)

*Primary Examiner* — Brook Kebede
(74) *Attorney, Agent, or Firm* — Eschweiler & Associates, LLC

(57) ABSTRACT

A silicon carbide device includes a silicon carbide substrate, an inorganic passivation layer structure and a molding material layer. The inorganic passivation layer structure laterally covers at least partly a main surface of the silicon carbide substrate and the molding material layer is arranged adjacent to the inorganic passivation layer structure.

16 Claims, 6 Drawing Sheets

(51) Int. Cl.
*H01L 21/04* (2006.01)
*H01L 29/66* (2006.01)
*H01L 21/56* (2006.01)
*H01L 23/29* (2006.01)
*H01L 23/31* (2006.01)
*H01L 29/78* (2006.01)
*H01L 29/06* (2006.01)
*H01L 29/872* (2006.01)

(52) U.S. Cl.
CPC ......... *H01L21/0495* (2013.01); *H01L 21/565* (2013.01); *H01L 23/291* (2013.01); *H01L 23/293* (2013.01); *H01L 23/3135* (2013.01); *H01L 23/3171* (2013.01); *H01L 29/0623* (2013.01); *H01L 29/6606* (2013.01); *H01L 29/66068* (2013.01); *H01L 21/047* (2013.01); *H01L 29/0615* (2013.01); *H01L 29/0619* (2013.01); *H01L 29/7811* (2013.01); *H01L 29/872* (2013.01); *H01L 2924/0002* (2013.01)

(56) References Cited

U.S. PATENT DOCUMENTS

| | | | |
|---|---|---|---|
| 6,034,385 | A | 3/2000 | Stephani et al. |
| 6,232,625 | B1 | 5/2001 | Bartsch et al. |
| 6,573,128 | B1 | 6/2003 | Singh |
| 7,144,797 | B2 | 12/2006 | Chow |
| 8,525,254 | B2 | 9/2013 | Treu et al. |
| 9,202,940 | B2 | 12/2015 | Kawakami et al. |
| 9,245,944 | B2 | 1/2016 | Rupp et al. |
| 2002/0094667 | A1 | 7/2002 | Bakowski et al. |
| 2003/0224612 | A1 | 12/2003 | Merrett et al. |
| 2005/0082611 | A1 | 4/2005 | Peake et al. |
| 2006/0284195 | A1* | 12/2006 | Nagai .................. F21K 9/00 257/98 |
| 2007/0029573 | A1 | 2/2007 | Cheng et al. |
| 2007/0096107 | A1* | 5/2007 | Brown ................ H01L 21/049 257/77 |
| 2007/0222023 | A1 | 9/2007 | Schmidt |
| 2008/0001159 | A1 | 1/2008 | Ota et al. |
| 2009/0078971 | A1 | 3/2009 | Treu et al. |
| 2009/0218621 | A1 | 9/2009 | Pfirsch et al. |
| 2014/0291695 | A1 | 10/2014 | Schulze et al. |
| 2014/0291697 | A1 | 10/2014 | Rupp et al. |

FOREIGN PATENT DOCUMENTS

| | | |
|---|---|---|
| JP | 2013026249 A | 2/2013 |
| JP | 2014155210 A | 8/2014 |
| WO | 9922407 A1 | 5/1999 |

OTHER PUBLICATIONS

Non-Final Office Action dated Sep. 8, 2014 in connection with U.S. Appl. No. 14/033,631.
Non-Final Office Action dated Jul. 29, 2014 in connection with U.S. Appl. No. 13/850,374.
Notice of Allowance dated Dec. 24, 2014 in connection with U.S. Appl. No. 13/850,374.
Final Office Action dated Jul. 9, 2015 for U.S. Appl. No. 14/033,631.
Notice of Allowance Dated Sep. 25, 2015 U.S. Appl. No. 14/033,631.
Non-Final Office Action dated Mar. 19, 2015 for U.S. Appl. No. 14/033,631.
Non Final Office Action Dated Dec. 11, 2015 U.S. Appl. No. 14/644,607.
Notice of Allowance Dated Apr. 13, 2016 U.S. Appl. No. 14/644,607.

* cited by examiner

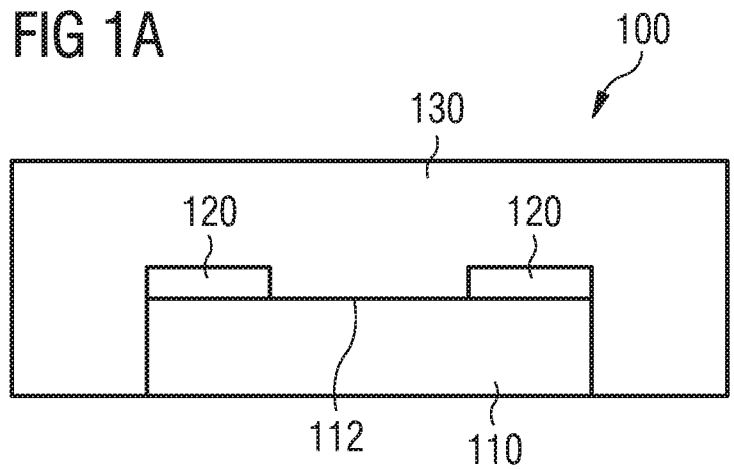
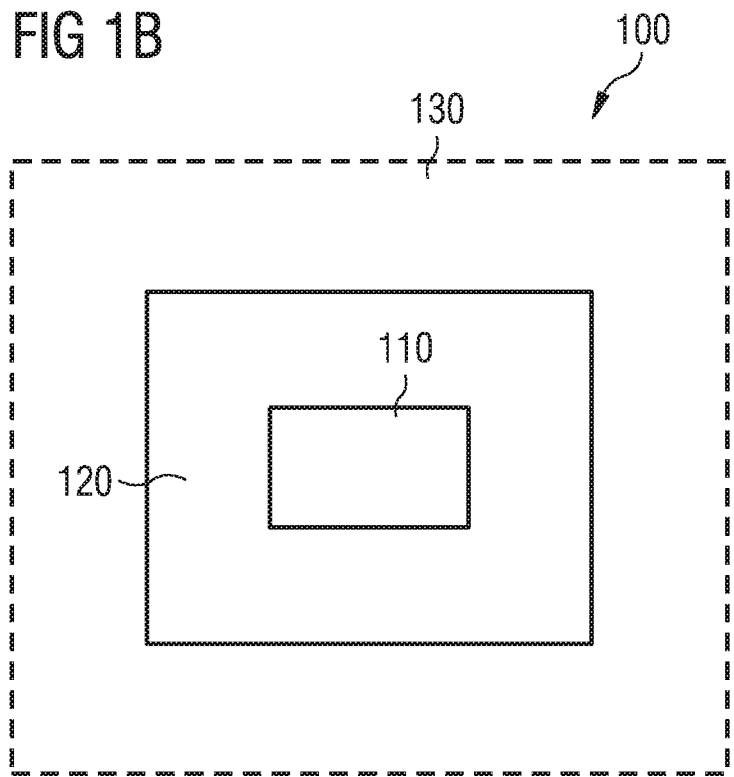

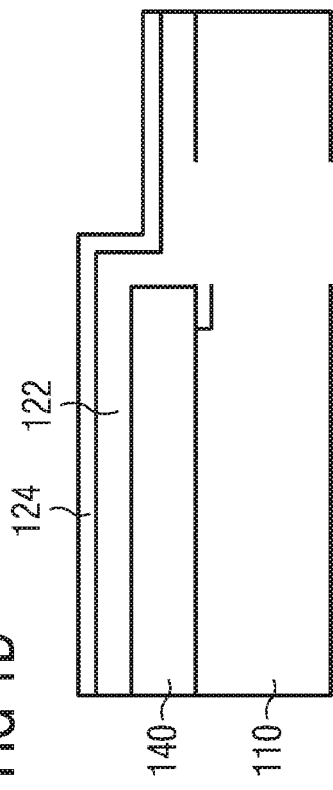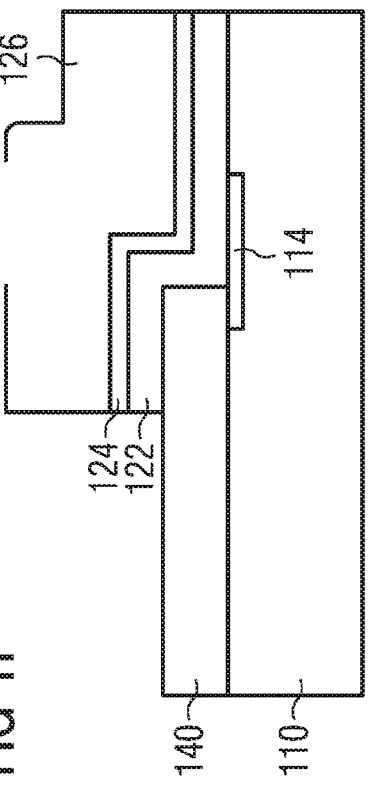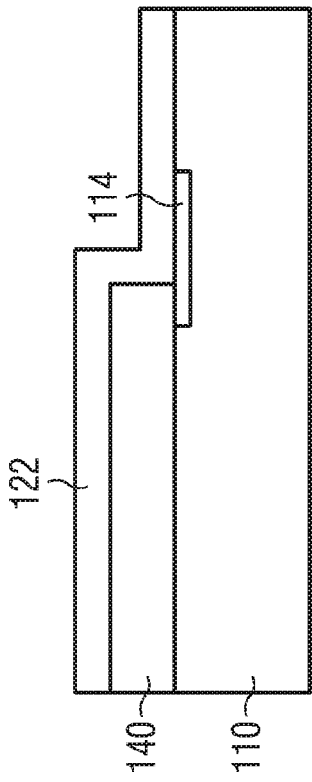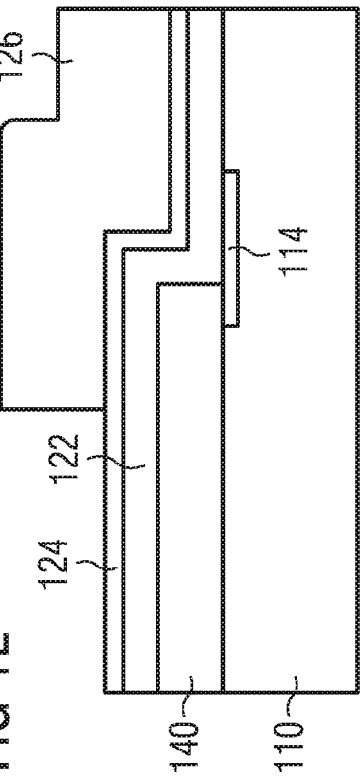

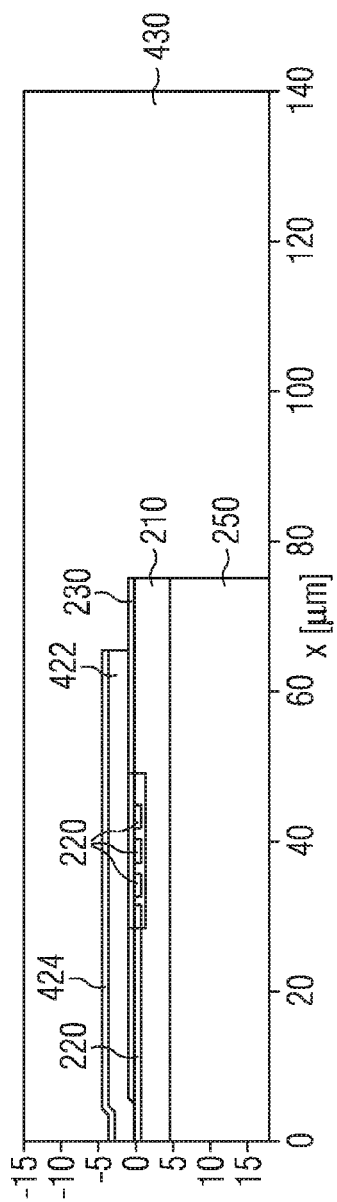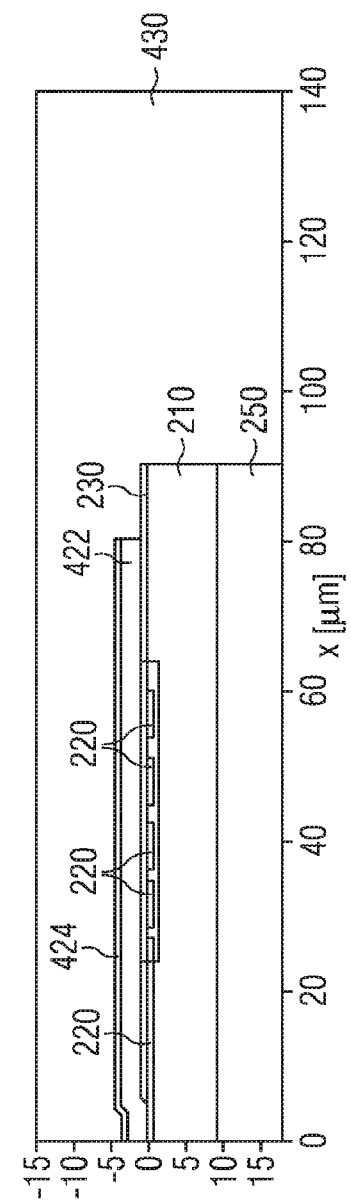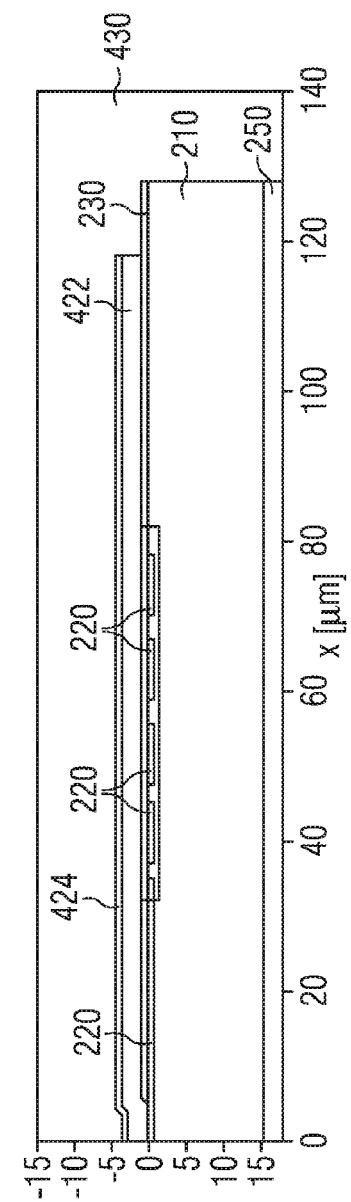

SILICON CARBIDE DEVICE AND A METHOD FOR FORMING A SILICON CARBIDE DEVICE

REFERENCE TO RELATED APPLICATION

This Application is a Continuation of U.S. application Ser. No. 14/033,631 filed on Sep. 23, 2013, which is a Continuation-in-part of U.S. application Ser. No. 13/850,374 filed on Mar. 26, 2013 (now U.S. Pat. No. 9,035,322 issued on May 19, 2015); the contents of both applications are hereby incorporated by reference in their entirety.

FIELD

Embodiments relate to silicon carbide technologies and in particular to a silicon carbide device and a method for forming a silicon carbide device.

BACKGROUND

Silicon carbide devices comprise a high breakdown field strength, which is similarly high as the maximal tolerable field strength in thermally grown silicon dioxide, due to the large band gap. At the semiconductor surface of silicon carbide devices (e.g. at the edge termination), very high electrical fields can occur, which represent high stress at least for the passivation layers. For example, electric fields in the range of more than 1.5 MV/cm can occur at the edge region of silicon carbide device implementations so that a passivation with a material comprising good breakdown resistance like polyimide (>3 MV/cm) may be required. However, a polyimide passivation may gather moisture, which may cause corrosion of the silicon carbide.

Therefore, a passivation taking into account high electric fields and moisture is important for the breakdown behavior and the long-term reliability of silicon carbide devices.

SUMMARY

A silicon carbide device according to an embodiment comprises a silicon carbide substrate, an inorganic passivation layer structure and a molding material layer. The inorganic passivation layer structure laterally covers at least partly a main surface of the silicon carbide substrate and the molding material layer is arranged adjacent to the inorganic passivation layer structure.

By using an inorganic passivation structure for protecting the silicon carbide surface, the electric field can be sufficiently reduced for a direct contact with the molding material layer and a contact of the silicon carbide surface with a moisture gathering material (e.g. polyimide) can be avoided. In this way, the breakdown behavior and the long-term reliability of the silicon carbide device can be improved.

Some embodiments relate to a silicon carbide device comprising a silicon carbide substrate and an inorganic passivation layer structure laterally covering at least partly a main surface of the silicon carbide substrate. The silicon carbide substrate and the inorganic passivation layer are configured so that an electric field at a surface of the inorganic passivation layer structure located opposite to the silicon carbide substrate is lower than 500 kV/cm while at least one region of the silicon carbide substrate comprises at least an electric field of 2.3 MV/cm.

By using an inorganic passivation structure in combination with field reduction measures within the silicon carbide substrate, the field at the outer surface of the inorganic passivation structure can be reduced below 500 kV/cm although a field of at least 2.3 MV/cm occurs within the silicon carbide substrate. In this way, a large variety of organic materials beside polyimide with better moisture resistance than polyimide can be used for an additional passivation layer on top of the inorganic passivation structure. Alternatively, a molding material can be implemented adjacent to the inorganic passivation structure. The breakdown behavior and long-term reliability of the silicon carbide device may be improved.

In some embodiments, the silicon carbide substrate comprises an epitaxial silicon carbide layer comprising a first conductivity type and a buried lateral silicon carbide edge termination region located within the epitaxial silicon carbide layer comprising a second conductivity type. The buried lateral silicon carbide edge termination region is covered by a silicon carbide surface layer comprising the first conductivity type.

Due to the buried lateral silicon carbide edge termination region, electrical fields occurring during the operation of the silicon carbide device can be reduced towards the edge of the silicon carbide device. Further, the buried lateral silicon carbide edge termination region can be protected from a degradation (e.g. from an oxidation) by burying the buried lateral silicon carbide edge termination region below the silicon carbide surface layer. In this way, a high temperature stability and/or moisture resistance can be achieved resulting in an improved breakdown behavior and/or an improved long-term reliability. Further, the electrical field at the surface of the silicon carbide device towards the edge can be reduced due to the silicon carbide surface layer.

Some embodiments relate to a buried lateral silicon carbide edge termination region comprising a thickness so that the depletion zone of the p-n-junction of the buried lateral silicon carbide edge termination region and the silicon carbide surface layer extends at least at one point up to the surface of the silicon carbide surface layer opposite to the buried lateral silicon carbide edge termination region at least in a predefined state of the silicon carbide device. In this way, a leakage current through the silicon carbide surface layer can be avoided or can be kept low.

Some embodiments relate to a method for forming a silicon carbide device comprising forming an inorganic passivation layer structure laterally covering at least partly a main surface of a silicon carbide substrate and forming a molding material layer adjacent to the inorganic passivation layer structure.

In this way, a silicon carbide device with improved breakdown behavior and long-term reliability can be provided with low effort.

In some embodiments, the method for forming a silicon carbide device further comprises at least forming an epitaxial silicon carbide layer with a first conductivity type and manufacturing a buried lateral silicon carbide edge termination region located within the epitaxial silicon carbide layer with a second conductivity type. The buried lateral silicon carbide edge termination region is formed so that it is covered by a silicon carbide surface layer comprising the first conductivity type.

The proposed method enables the manufacturing of a buried edge termination. Due to the buried lateral silicon carbide edge termination region, electrical fields occurring during the operation of the silicon carbide device can be reduced towards the edge of the silicon carbide device. Further, the buried lateral silicon carbide edge termination region can be protected from a degradation (e.g. from an oxidation) by burying the buried lateral silicon carbide edge termination region below the silicon carbide surface layer. In this way, a high temperature stability and/or moisture resistance can be achieved resulting in an improved breakdown behavior and/or an improved long-term reliability. Further, the electrical field at the surface of the silicon carbide device can be reduced due to the silicon carbide surface layer.

In some embodiments, the manufacturing of the buried lateral silicon carbide edge termination region comprises implanting ions of the second conductivity type into the epitaxial silicon carbide layer through a surface region of the epitaxial silicon carbide layer representing the silicon carbide surface layer so that the buried lateral silicon carbide edge termination region is covered by the silicon carbide surface layer of the epitaxial silicon carbide layer. In this way, a buried layer can be implemented with low effort.

Some further embodiments relate to a manufacturing of the buried lateral silicon carbide edge termination region comprising implanting ions of the second conductivity type into a surface region of the epitaxial silicon carbide layer so that the buried lateral silicon carbide edge termination region is exposed at the surface of the epitaxial silicon carbide layer. Further, the silicon carbide surface layer is deposited epitaxially on top of the epitaxial silicon carbide layer so that the buried lateral silicon carbide edge termination region is covered by the silicon carbide surface layer. In this way, a smearing of the implanted ions at the edge of the buried lateral silicon carbide edge termination region into the silicon carbide surface layer can be avoided. Further, the silicon carbide surface layer can be implemented with almost arbitrary thickness. Further, the doping concentration of the silicon carbide surface layer can be selected in a wide range and independent of the doping concentration of the epitaxial silicon carbide layer comprising the buried lateral silicon carbide edge termination region.

BRIEF DESCRIPTION OF THE DRAWINGS

Some embodiments of apparatuses and/or methods will be described in the following by way of example only, and with reference to the accompanying figures, in which FIG. 1A shows a schematic cross-section of a silicon carbide device;

FIG. 1B shows a schematic top view of the silicon carbide device shown in FIG. 1A;

FIG. 1C-1F show schematic cross-sections illustrating a forming of a silicon carbide device;

FIG. 4A-4C show schematic cross-sections of silicon carbide devices;

DETAILED DESCRIPTION

Figure 1G:
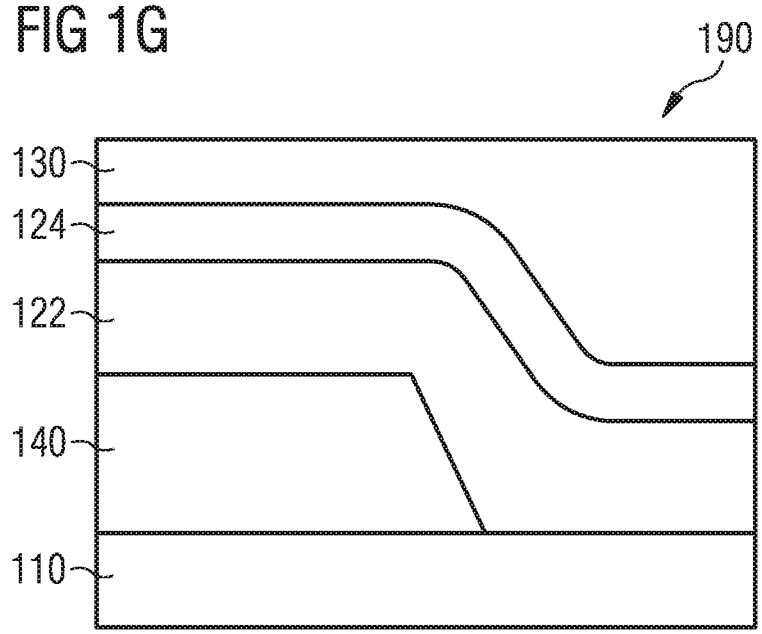
FIG. 1G shows a schematic cross-section of a part of a silicon carbide device.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

FIGS. 1A and 1B show a schematic illustration of a silicon carbide device 100 according to an embodiment. The silicon carbide device 100 comprises a silicon carbide substrate 110, an inorganic passivation layer structure 120 and a molding material layer 130. The inorganic passivation layer structure 120 laterally covers at least partly a main surface 112 of the silicon carbide substrate 110 and the molding material layer 130 is arranged adjacent to the inorganic passivation layer structure 120.

By using an inorganic passivation structure 120 for protecting the silicon carbide surface 112, the electric field can be sufficiently reduced for a direct contact with the molding material layer 130, and a contact of the silicon carbide surface 112 with a moisture gathering material (e.g. polyimide) can be avoided. In this way, the breakdown behavior and the long-term reliability of the silicon carbide device 100 can be improved.

The silicon carbide substrate 100 may be a semiconductor substrate based on silicon carbide comprising at least mainly (e.g. more than 50%, more than 70% or more than 90%) silicon carbide. The silicon carbide substrate may comprise a configuration (e.g. regarding epitaxial layer arrangement and doping) depending on the type (e.g. Schottky diode, merged pin Schottky diode, p-n diode, bipolar transistor, field effect transistor, metal oxide semiconductor transistor or junction gate field effect transistor) of silicon carbide device 100.

The main surface 112 of the silicon carbide device 100 may be a surface of the silicon carbide substrate 110 of the silicon carbide device 100 towards metal layers, insulation layers or passivation layers (e.g. the inorganic passivation layer structure) on top of the silicon carbide layers. In comparison to a basically vertical edge surface (e.g. resulting from separating the silicon carbide substrate of the silicon carbide device from others) of the silicon carbide device 100, the main surface 112 of the silicon carbide device 100 may be a basically horizontal surface. The main surface 112 of the silicon carbide device 100 may be a basically even plane (e.g. neglecting unevenness of the silicon carbide layers due to the manufacturing process). The main surface 112 may be the interface for connecting at least a part of the active areas (e.g. semiconductor regions of the silicon carbide structure used for implementing an electrical functionality of the silicon carbide device) of the silicon carbide substrate to a metal layer (e.g. implementing a bond pad or connecting the active area to a bond pad). Further, the silicon carbide substrate may comprise a backside surface (e.g. used for implementation of a backside contact) opposite to the main surface.

The lateral expansion or extension of a layer may be the expansion in parallel to the main surface 112 of the silicon carbide device 110.

In other words, the main surface 112 of the silicon carbide device 110 may be the interface between the silicon carbide and an insulation layer, metal layer or passivation layer on top of the silicon carbide. In comparison, the edge of the silicon carbide device 100 is basically a surface orthogonal to the main surface 112 of the silicon carbide device 100.

In view of this definition, a layer of the silicon carbide device 100 may basically or mainly expand in two lateral directions and comprises a thickness measured orthogonally to the lateral directions.

The inorganic passivation layer structure 120 may comprise mainly (e.g. more than 50%, more than 70% or more than 90% or exclusively inorganic material) inorganic material (e.g. silicon oxide or silicon nitride). The inorganic passivation layer structure 120 may comprise one or more inorganic passivation layers arranged on top of the main surface 112 of the silicon carbide device 110. An inorganic passivation layer may be a silicon oxide layer (e.g. mainly comprising $SiO_2$), a silicon nitride layer (e.g. mainly comprising $Si_3N_4$) or a silicon oxinitride layer (e.g. mainly comprising $SiO_xN_y$), for example. For example, the inorganic passivation layer structure 120 may comprise only a silicon oxinitride layer or a combination of a first layer (e.g. silicon oxide) and a second layer (e.g. silicon nitride). Alternatively, the inorganic passivation layer structure 120 may comprise further inorganic layers. For example, a silicon nitride layer may be arranged adjacent to the molding material layer 130 and a silicon oxide layer may be arranged adjacent to the silicon carbide substrate 110 or vice versa.

The inorganic passivation layer structure 120 reduces the electric field towards the molding material layer 130 and protects at least a part of the main surface 112 from moisture.

The thickness of the inorganic passivation layer structure 120 may be selected in a wide range depending on the type of silicon carbide device 100 and/or the voltages to be handled by the silicon carbide device 100, for example.

The inorganic passivation layer structure 120 may comprise a thickness and/or layer structure so that an electric field at a surface of the inorganic passivation layer structure 120 in contact with the molding material layer 130 is lower than 500 kV/cm (or lower than 1 MV/cm, lower than 700 kV/cm or lower than 400 kV/cm) in an active-state of the silicon carbide device. In this way, the electric field is sufficiently reduced in order to implement the molding material layer 130 in contact with the inorganic passivation layer structure 120. Alternatively, also the silicon carbide substrate 110 may comprise structure for reducing the electrical field towards the main surface 112 (e.g. edge termination structures). In other words, the silicon carbide substrate 110 in combination with the inorganic passivation layer structure 120 may be configured so that an electric field at a surface of the inorganic passivation layer structure 120 in contact with the molding material layer 130 is lower than 500 kV/cm (or lower than 1 MV/cm, lower than 700 kV/cm or lower than 400 kV/cm) in an active-state of the silicon carbide device 100. The electric field may be lower than 500 kV/cm throughout at least 50%, at least 80% or the whole surface of the inorganic passivation layer structure 120 located opposite to the silicon carbide substrate 110.

For example, the inorganic passivation layer structure 120 may comprise a thickness between 2 μm and 10 μm (or between 2.5 μm and 5 μm or between 3 μm and 4 μm). For example, the inorganic passivation layer structure 120 may comprise a silicon oxide layer with a thickness between 2 μm and 3.5 μm (e.g. 2.7 μm) and a silicon nitride layer with a thickness between 500 nm and 1 μm (e.g. 800 nm).

The active-state of the silicon carbide device 100 may be a state, in which the silicon carbide device 100 provides a maximal overall current under normal or intended operation conditions of the silicon carbide device 100 or provides a nominal current (e.g. according to the specification of the device). A nominal current may be a current, which the device is able to provide in an active-state for more than 50% (or more than 70% or more than 90%) of a life time to be reached by the device, for example. Alternatively, the active-state of the silicon carbide device 100 may be a state, in which at least a part of the silicon carbide substrate comprises at least an electric field of 2.3 MV/cm (or more than 3 MV/cm, more than 2 MV/cm or more than 1.5 MV/cm) or a maximal blocking voltage is applied to the silicon carbide device 100.

The molding material layer 130 may be a layer of molding material or soft casting material covering the silicon carbide die (e.g. silicon carbide substrate, metal layers, insulation layers and/or passivation layers) of the silicon carbide device 100. The molding material layer 130 may comprise at least mainly at least one of epoxy resin, silica or silica gel, for example.

The molding material layer 130 may be a laterally unstructured layer (e.g. without interrupted areas uncovering the inorganic passivation layer structure, a metal layer or the main surface of the silicon carbide substrate) along the main surface 112 of the silicon carbide substrate 110. In other words, the molding material layer may extend at least along the whole main surface 112 of the silicon carbide substrate 110 (e.g. neglecting electrical connections as bond wires or lead frames for connecting the silicon carbide device to an external device). Further, the molding material layer 130 may optionally extend also along the vertical edges of the silicon carbide substrate 110 as indicated in FIG. 1A.

The molding material layer 130 is arranged adjacent to the inorganic passivation layer structure 120. The inorganic passivation layer structure 120 may be the last inorganic layer of the silicon carbide die of the silicon carbide device 100 towards the molding material layer 130. In other words, the molding material layer 130 may be in direct contact with the inorganic passivation layer structure 120. An additional layer (e.g. polyimide) between the molding material layer 130 and the inorganic passivation layer structure 120 may not be necessary. In other words, the molding material layer 130 may be arranged adjacent to the inorganic passivation layer structure 120 without an organic material layer, especially polyimide material, in between. In this way, the resistance against moisture of the silicon carbide device 100 can be improved.

The inorganic passivation layer structure 120 may comprise at least one interrupted area, in which the silicon carbide substrate 110 or a metal layer on top of the silicon carbide substrate 110 is not covered by the inorganic passivation layer structure 120 as shown in FIGS. 1A and 1B, for example. In this way, a contact area of the silicon carbide substrate 110 or a metal layer connecting the contact area of the silicon carbide substrate 110 can be connected to an external device (e.g. by bond wires or a lead frame). Nevertheless, the at least one interrupted area may be covered by the molding material layer 130 (e.g. neglecting electrical connections as bond wires or lead frames for connecting the silicon carbide device to an external device). In other words, the inorganic passivation layer structure 120 may comprise at least one interrupted area. The main surface of the silicon carbide substrate 110 is uncovered by the inorganic passivation layer structure 120 within the at least one interrupted area of the inorganic passivation layer structure 120. Further, the molding material layer 130 may extend through the interrupted area of the inorganic passivation layer structure 120. In this way, the silicon carbide device 100 can be connected to an external device. For example, the whole main surface 112 of the silicon carbide substrate 110 may be covered either by the inorganic passivation layer structure 120 (e.g. at an edge region) or a metal layer (e.g. at an active region).

The inorganic passivation layer structure 120 may comprise an arbitrary number of interrupted areas. For example, the inorganic passivation layer structure 120 may comprise an interrupted area for each electrical contact (e.g. gate and source of a field effect transistor or collector and base of a bipolar transistor) to be connected with different external contacts or potentials of one or more external devices.

Depending on the type of silicon carbide device, high electric fields may occur at different regions of the main surface 112 of the silicon carbide substrate 110. For example, the region close to the edge of the silicon carbide substrate 110 (e.g. at devices with backside electrode or contact) or a region in the proximity of a pn-junction at the surface of the silicon carbide substrate may comprise high electric fields in an active-state of the silicon carbide device. Such regions may be covered by the inorganic passivation layer structure 120 so that the electric field is reduced towards the molding material layer 130.

For example, the silicon carbide substrate 110 comprises an edge region surrounding an active area of the silicon carbide substrate 110 at an edge of the silicon carbide substrate 110. The inorganic passivation layer structure 120 may be arranged in contact with the silicon carbide substrate 110 and the molding material layer 130 at least within the edge region. In other words, the inorganic passivation layer structure 120 may be located directly between the silicon carbide substrate 110 and the molding material layer 130 in the edge region of the silicon carbide substrate 110.

The active area (or cell area) of the silicon carbide substrate 110 may be a region laterally expanding over the silicon carbide substrate 110 comprising, causing or providing more than 50% (or more than 70%, more than 80% or more than 90%) of the current flow through the silicon carbide device 100 in an active-state of the silicon carbide substrate 110 or may provide a main functionality (e.g. transistor, diode or circuitry) of the silicon carbide substrate 110, for example.

Optionally, additionally or alternatively to one or more aspects mentioned above, the silicon carbide substrate 110 may comprise measures for reducing the electric field within endangered regions (e.g. edge region). For example, the silicon carbide substrate 110 may comprise a junction termination extension region or one or more ring structures of opposite conductivity type within an edge region of the silicon carbide substrate 110.

For example, the silicon carbide substrate 110 may comprise an edge region surrounding an active area of the silicon carbide substrate 110 at an edge of the silicon carbide substrate 110. Further, the silicon carbide substrate 110 may comprise an epitaxial silicon carbide layer having mainly (e.g. more than 50%, more than 70% or more than 90% of the occupied volume) a first conductivity type and at least one edge termination region located within the edge region surrounding the active area of the silicon carbide substrate 110. The edge termination region may have a second conductivity type. In this way, the electric field within the edge region can be reduced towards the main surface of the silicon carbide substrate 110 so that an inorganic passivation layer structure 120 with lower thickness may be sufficient.

A first conductivity type can be a p-doping (e.g. caused by incorporating aluminum ions or boron ions during an epitaxy process) or an n-doping (e.g. caused by incorporating nitrogen ions, phosphor ions or arsenic ions during an epitaxy process). Consequently, the second conductivity type indicates an opposite n-doping or p-doping. In other words, the first conductivity type may indicate an n-doping and the second conductivity type may indicate a p-doping or vice-versa.

FIG. 1C-1F show a schematic illustration of the forming of an inorganic passivation layer structure on top of a silicon carbide substrate 110 with a junction termination extension region according to an embodiment.

The silicon carbide substrate 110 (e.g. a drift layer of a silicon carbide device to be formed) is covered towards the active area of the silicon carbide substrate 110 by a metal layer 140 implementing an electrical contact to the active area of the silicon carbide substrate 110. Further, the silicon carbide substrate 110 comprises a junction termination extension region 114 at the main surface of the silicon carbide substrate 110 laterally arranged at the edge of the metal layer 140 (e.g. metallization). On top of this structure, a silicon oxide layer 122 is deposited as shown by FIG. 1C. This is followed by a deposition of a silicon nitride layer 124 as shown by FIG. 1D. The silicon oxide layer 122 and the silicon nitride layer 124 represent the inorganic passivation layer structure.

Additionally, a polyimide layer 126 is deposited and structured so that the silicon nitride layer 124 is uncovered above the metal layer 140 as shown by FIG. 1E. The structured polyimide layer 126 is used as mask for structuring the inorganic passivation layer structure. In other words, the silicon nitride layer 124 and the silicon oxide layer 122 are removed at areas not covered by the polyimide layer 126 as shown by FIG. 1F.

Afterwards, the polyimide layer 126 is removed and the die is molded by a molding material layer so that the molding material layer is located adjacent to the inorganic passivation layer structure.

FIG. 1C-1F show an example for a process for depositing and structuring of a hard passivation.

FIG. 1G shows a schematic cross-section of a part of a silicon carbide device 190 according to an embodiment. The implementation of the silicon carbide device 190 is similar to the implementation shown in FIG. 1A. Additionally, the silicon carbide substrate 110 is covered towards the active area of the silicon carbide substrate 110 by a metal layer 140 (e.g. aluminum edge) implementing an electrical contact to the active area of the silicon carbide substrate 110. On top of this structure, a silicon oxide layer 122 (e.g. undoped silicate glass) and a silicon nitride layer 124 is deposited representing the inorganic passivation layer structure.

The example shown in FIG. 1G may illustrate a hard passivation stack at an anode edge of a silicon carbide diode (e.g. 2.7 µm undoped silicate glass and 800 nm silicon nitride).

Figure 2A:
FIG. 2A, 2B show schematic cross-sections of silicon carbide devices.

FIG. 2A shows a schematic illustration of a cross-section of a silicon carbide device 200 according to an embodiment. The implementation of the silicon carbide device 200 is similar to the implementation shown in FIG. 1A. Additionally, the silicon carbide substrate comprises an epitaxial silicon carbide layer 210 comprising a first conductivity type and a buried lateral silicon carbide edge termination region 220 located within the epitaxial silicon carbide layer 210 comprising a second conductivity type. Further, the buried lateral silicon carbide edge termination region 220 is covered by a silicon carbide surface layer 230 comprising the first conductivity type.

Further, an inorganic passivation layer structure and a molding material layer are arranged on top of the silicon carbide substrate (not shown).

Due to the buried lateral silicon carbide edge termination region 220, the electric field in an operating state is reduced toward the edge of the silicon carbide device so that the breakdown behavior can be improved. Further, an oxidation of the buried lateral silicon carbide edge termination region 220 can be avoided by covering the buried lateral silicon carbide edge termination region 220 with a silicon carbide surface layer 230. Additionally, an oxidation of the silicon carbide surface layer 230 may be avoided. In this way, the breakdown behavior and/or the long-time reliability can be significantly improved. Further, the electrical field at the surface of the silicon carbide device can be reduced due to the silicon carbide surface layer.

The epitaxial silicon carbide layer 210 may be epitaxially grown on a silicon carbide substrate material, may be bonded or attached to a carrier substrate or may be provided without substrate material.

The epitaxial silicon carbide layer 210 comprises a first conductivity type which can be a p-doping (e.g. caused by incorporating aluminum ions or boron ions during epitaxy process) or an n-doping (e.g. caused by incorporating nitrogen ions, phosphor ions or arsenic ions during epitaxy process).

The buried lateral silicon carbide edge termination region 220 is manufactured within the epitaxial silicon carbide layer 210. This region extends laterally towards the edge of the silicon carbide device 200 and represents at least one part of an edge termination structure. This region 220 is buried below the silicon carbide surface layer 230, which means that the buried lateral silicon carbide edge termination region 220 is not exposed at the main surface of the silicon carbide device, for example.

The buried lateral silicon carbide edge termination region 220 may be part of a larger implant area comprising the second conductivity type within the epitaxial silicon carbide layer 210. In other words, the buried lateral silicon carbide edge termination region 220 may be a part of an implant area which is close to the edge of the silicon carbide device (e.g. closer than 200 µm, closer than 100 µm, closer than 50 µm or closer than 20 µm, which may depend on the type of silicon carbide device or the die area occupied by the silicon carbide device). In other words, an implant area comprising the second conductivity type may be located within the epitaxial silicon carbide layer 210 which comprises a lateral end located close to an edge of the silicon carbide device covered by a silicon carbide surface layer 230. This lateral end of the implant area may represent or form the buried lateral silicon carbide edge termination region 220. Alternatively, the buried lateral silicon carbide edge termination region 220 may be a limited implant area located in the proximity of the edge of the silicon carbide device 200 (e.g. closer than 200 µm, closer than 100 µm, closer than 50 µm or closer than 20 µm, which may depend on the type of silicon carbide device, the blocking voltage of the silicon carbide device or the die area occupied by the silicon carbide device) being surrounded by silicon carbide comprising the first conductivity type.

The buried lateral silicon carbide edge termination region 220 is covered by the silicon carbide surface layer 220 so that the buried lateral silicon carbide edge termination region 220 is not exposed at the main surface of the silicon carbide device 200. In other words, the silicon carbide surface layer 230 is located on top of the buried lateral silicon carbide edge termination region 220 so that an exposure of the buried lateral silicon carbide edge termination region 220 at the main surface of the silicon carbide device 200 may be prevented.

In other words, the silicon carbide surface layer 230 may form a termination towards upper non-semiconductor layers of the silicon carbide device 200.

Optionally, additionally or alternatively to one or more aspects mentioned before, the silicon carbide surface layer may extend laterally at least from a lateral end of the buried lateral silicon carbide edge termination region 220 close to the edge of the silicon carbide device (e.g. the lateral end of the buried lateral silicon carbide edge termination region closer to the edge than the other end in a cross-section of the silicon carbide device) to an active area of the silicon carbide device, while the active area is left out by the silicon carbide surface layer 230. In other words, the silicon carbide surface layer 230 covers the buried lateral silicon carbide edge termination region 220 close to the edge of the silicon carbide device 200, but leaves the active area open so that the active area is exposed at a main surface of the silicon carbide device 200 or the silicon carbide material. In this way, the active area can be accessible for an upper metal layer, an insulation layer or a passivation layer (e.g. for implementing a metal contact and/or the wiring of the silicon carbide device).

An active area of the silicon carbide device 200 may be a central area on the die of the silicon carbide device 200 surrounded by an edge region. The active area of the silicon carbide device 200 may be an area of the silicon carbide device 200 for implementing the electrical functionality of the silicon carbide device 200. The width of the edge region may depend on the blocking voltage, the functionality and/or the die size of the silicon carbide device 200.

Further optionally, alternatively or additionally to one or more aspects mentioned above, the buried lateral silicon carbide edge termination region 220 may laterally end with a predefined distance to the edge of the silicon carbide device so that at least a lateral end located close to the edge of the silicon carbide device is surrounded by silicon carbide with the first conductivity type. In other words, an exposure of the buried lateral silicon carbide edge termination region 220 at the edge of the silicon carbide device 200 may be avoided in the lateral direction towards the edge of the silicon carbide device by implementing the buried lateral silicon carbide edge termination region 220 with a predefined lateral distance to the edge of the silicon carbide device. In this way, the buried lateral silicon carbide edge termination region 220 may be completely surrounded by the silicon carbide surface layer 230 and the epitaxial silicon carbide layer 210 so that the buried lateral silicon carbide edge termination region 220 and/or the silicon carbide surface layer 230 can be protected against environmental damages. The predefined distance to the edge of the silicon carbide device 200 may vary in dependency on the size and functionality of the silicon carbide device 200. For example, the predefined distance may be between 5 µm and 200 µm, 5 µm and 50 µm or 10 µm and 30 µm.

The buried lateral silicon carbide edge termination region 220 can be implemented or manufactured in different ways. For example, the buried lateral silicon carbide edge termination region 220 may be manufactured by a high energy implant through the surface of the epitaxial silicon carbide layer 210 (e.g. through a part of the surface of the silicon carbide device determined by an implant mask used for masking the implant) so that an implant area is formed within the epitaxial silicon carbide layer 210 in a depth and with a thickness depending on an energy distribution of the ions used for the implant. In other words, the silicon carbide surface layer 230 may be part of the epitaxial silicon carbide layer 210 (e.g. indicated in FIG. 2A) and the buried lateral silicon carbide edge termination region 220 may be an implant region manufactured by implanting ions of the second conductivity type into the epitaxial silicon carbide layer 210 through a surface region of the epitaxial silicon carbide layer 210 representing the resulting silicon carbide surface layer 220. In this way, a buried lateral silicon carbide edge termination region 220 can be implemented with low effort and a low number of manufacturing steps.

Alternatively, the buried lateral silicon carbide edge termination region 220 may be manufactured by implanting ions into a surface region of the epitaxial silicon carbide layer 210 and depositing the silicon carbide surface layer 230 epitaxially on top of the epitaxial silicon carbide layer 210. The surface region may be a part of the epitaxial silicon carbide layer 210 located at the surface of the epitaxial silicon carbide layer 210. In other words, the silicon carbide surface layer 230 may be an epitaxial layer deposited on top of the epitaxial silicon carbide layer 210 with the buried lateral silicon carbide edge termination region 220. In this way, a smearing of the implant area at the edge of the buried lateral silicon carbide edge termination region 220 (e.g. due to the impact of the edge profile of the implantation mask) can be avoided and/or the thickness of the silicon carbide surface layer 230 can be varied in a large range.

Alternatively, ions of the first conductivity type may be implanted with a higher doping concentration than the buried lateral silicon carbide edge termination region 220 into the surface region of the epitaxial silicon carbide layer 210 so that the silicon carbide surface layer 230 is formed.

Optionally, additionally or alternatively to one or more aspects mentioned above, the buried lateral silicon carbide edge termination region 220 can be implemented with a variation of lateral doping. In other words, the buried lateral silicon carbide edge termination region 220 may comprise a varying lateral doping concentration. The varying doping concentration may decrease towards the edge of the silicon carbide device. The decreasing may be implemented in steps or continuously. In still other words, the buried lateral silicon carbide edge termination region 220 may comprise a first area with a first doping concentration and a second area with a second doping concentration, wherein the first area is closer to the edge of the silicon carbide device 200 than the second area and the first doping concentration is lower than the second doping concentration. In this way, the electrical field strength towards the edge of the silicon carbide device 200 can be further reduced resulting in an improved breakdown behavior and/or long-time reliability.

Optionally, alternatively or additionally to one or more aspects mentioned above, the buried lateral silicon carbide edge termination region 220 may surround the active area of the silicon carbide device (e.g. in a topside view or laterally or along the edges of the silicon carbide device). In other words, the buried lateral silicon carbide edge termination region 220 may be located within an edge region (e.g. extending 5 µm and 500 µm, between 10 µm and 500 µm, between 15 µm and 200 µm or between 50 µm and 200 µm from the edge towards a center of the silicon carbide device) of the silicon carbide device 200 surrounding the active area of the silicon carbide device 200. In this way, the electrical field strength can be kept low along the whole edge of the silicon carbide device 200. Alternatively, the buried lateral silicon carbide edge termination region 220 may only be implemented along regions of the edge comprising high electrical fields in an operating state of the silicon carbide device 200.

For example, the buried lateral silicon carbide edge termination region 220 may comprise a thickness between 200 nm and 5 µm (or between 400 nm and 2 µm, between 500 nm and 1 µm or between 600 nm and 800 nm). In other words, the thickness of the buried lateral silicon carbide edge termination region 220 can be selected within a wide range and may be fit to the desired functionality (e.g. diode, transistor) of the silicon carbide device.

The thickness of a layer may be an average thickness, since the thickness of a layer may slightly vary due to manufacturing issues, for example. For example, the thickness of the buried lateral silicon carbide edge termination region 220 may be measured between the p-n-junction towards the silicon carbide surface layer 230 and the p-n-junction at the opposite side of the buried lateral silicon carbide edge termination region 220 towards the epitaxial silicon carbide layer 210. Similarly, a thickness of the silicon carbide surface layer 230 may be measured between the p-n-junction to the buried lateral silicon carbide edge termination region 220 and the opposite (e.g. exposed) surface of the silicon carbide surface layer 230. For example, the silicon carbide surface layer comprises a thickness between 20 nm and 2 µm (or between 50 nm and 200 nm, between 50 nm and 1500 nm, between 200 nm and 1000 nm or between 600 nm and 1 µm). The thickness of the silicon carbide surface layer may be between 50 nm and 200 nm for a silicon carbide surface layer 230 resulting from a manufacturing of the buried lateral silicon carbide edge termination region 220 by implanting ions of the second conductivity type into the epitaxial silicon carbide layer through a surface region of the epitaxial silicon carbide layer 220, for example. Alternatively, the thickness of the silicon carbide surface layer 230 may be between 600 nm and 1 µm for a silicon carbide surface layer 230 manufactured by depositing an epitaxial layer on top of the epitaxial silicon carbide layer 210 comprising the buried lateral silicon carbide edge termination region 220, for example.

Optionally, additionally or alternatively to one or more aspects mentioned above, a plurality of buried lateral silicon carbide edge termination regions may be manufactured (e.g. p-rings, ring-shaped regions, point-shaped, saw-tooth-shaped, wavelike regions). In this way, the breakdown behavior and/or the long-term reliability may be improved.

Figure 2B:
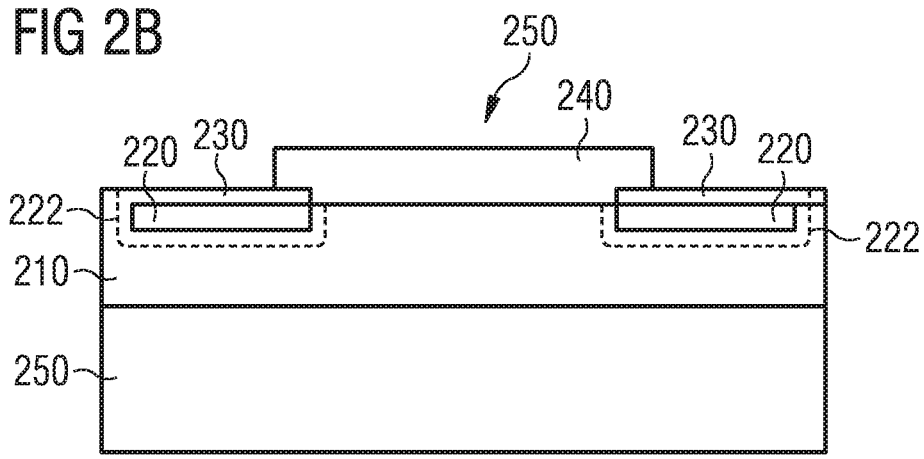

Optionally, additionally or alternatively to one or more aspects mentioned above, the thicknesses of the buried lateral silicon carbide edge termination region 220 and/or the silicon carbide surface layer 230 as well as the doping concentrations of the buried lateral silicon carbide edge termination region 220 and/or the silicon carbide surface layer 230 may be selected so that the silicon carbide surface layer 230 may comprise at least one region cleared from free charge carriers. Such an example is shown in FIG. 2B. FIG. 2B shows the schematic illustration of a silicon carbide device 250 according to an embodiment. The silicon carbide surface layer 230 comprises a thickness and a doping concentration so that the depletion zone 222 (indicated by dotted lines) of the p-n-junction of the buried lateral silicon carbide edge termination region 220 and the silicon carbide surface layer 230 extends at least at one point up to the surface of the silicon carbide surface layer 230 opposite to the buried lateral silicon carbide edge termination region 220 (e.g. up to the main surface) in a predefined state (e.g. off state or on state of the silicon carbide device or without any electrical potential applied to the silicon carbide device or floating connections) of the silicon carbide device 250.

In this way, a leakage current through the silicon carbide surface layer 230 (e.g. between the optionally indicated metal contact 240 and the epitaxial silicon carbide layer 210 at the edge of the silicon carbide device) can be avoided or significantly reduced. Optionally, the silicon carbide surface layer 230 comprises a thickness and a doping concentration (e.g. as well as the buried lateral silicon carbide edge termination region) so that the depletion zone extends through the whole silicon carbide surface layer 230. In other words, the thicknesses and/or doping concentrations of the silicon carbide surface layer 230 and/or the buried lateral silicon carbide edge termination region 220 may be selected so that the complete silicon carbide surface layer 230 is cleared of free charge carriers (e.g. neglecting a free charge carrier density typical for a depletion zone).

For example, a sufficient expansion of the depletion zone 222 may be obtained by selecting appropriate thickness and doping concentration of the silicon carbide surface layer 230 depending on the doping concentration of the buried lateral silicon carbide edge termination region 220. Further, a thickness of the buried lateral silicon carbide edge termination region 220 may be larger than a thickness of the silicon carbide surface layer 230, for example.

Optionally, the silicon carbide device 200 comprises a metal contact 240 on top of the active area (e.g. on top of the epitaxial silicon carbide layer) of the silicon carbide device 200 as indicated in FIG. 2B. In this way, a silicon carbide Schottky diode can be implemented. Exemplarily, the epitaxial silicon carbide layer 210 and the silicon carbide surface layer 230 may comprise an n-doping and the buried lateral silicon carbide edge termination region 220 may comprise a p-doping. The buried lateral silicon carbide edge termination region 220 may surround the active area of the silicon carbide device 250 (e.g. in a top view of the silicon carbide device). Further, the silicon carbide surface layer 230 may extend from an edge of the silicon carbide device 200 along the buried lateral silicon carbide edge termination region 220 to the edge of the buried lateral silicon carbide edge termination region 220 opposite to the end at the edge of the silicon carbide device 250. Consequently, also the silicon carbide surface layer 230 surrounds the active area of the silicon carbide device 200 and leaves open the active area for the connection to the metal contact 240. In this example, the epitaxial silicon carbide layer 210 represents an n-drift layer which is arranged on top of a silicon carbide substrate material 250.

Further, an inorganic passivation layer structure and a molding material layer are arranged on top of the silicon carbide substrate (not shown).

Figure 3:
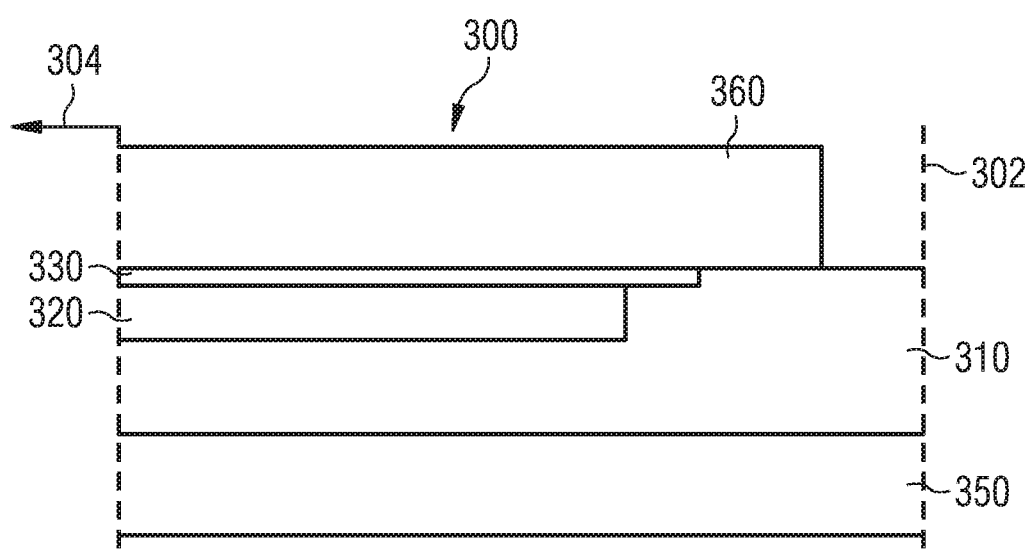
FIG. 3 shows a schematic cross-section of an edge region of a silicon carbide device.

FIG. 3 shows a schematic illustration of a silicon carbide edge termination with buried p-region according to an embodiment. The implementation of the silicon carbide device 300 is similar to the implementation shown in FIG. 2A. The shown silicon carbide edge termination represents an edge region of a silicon carbide device 300. The silicon carbide device 300 comprises at least in this edge region a highly n-doped silicon carbide substrate 350 followed by an n-doped silicon carbide drift layer 310 adjusted to the particular silicon carbide device 300 (e.g. Schottky diode, merged pin Schottky diode, p-n diode, bipolar transistor, field effect transistor, metal oxide semiconductor transistor or junction gate field effect transistor) and/or the voltage class of the silicon carbide device 300. The epitaxial silicon carbide layer 310 comprises a p-doped silicon carbide region 320 for the edge termination representing a buried lateral silicon carbide edge termination region. The buried lateral silicon carbide edge termination region 320 is covered by an n-doped silicon carbide layer 330 representing a silicon carbide surface layer. The silicon carbide surface layer 330 is exposed at the main surface of the silicon carbide device 300. An inorganic passivation layer structure 360 is implemented on top of the silicon carbide surface layer 330. The buried lateral silicon carbide edge termination region 320 laterally ends with a predefined distance to the edge 302 of the silicon carbide device 300. The buried lateral silicon carbide edge termination region 320 may be part of a larger implant area extending further towards the active chip area 304 (or active area of the silicon carbide device). The silicon carbide surface layer 330 laterally ends with a predefined distance (e.g. less than the predefined distance of the buried lateral silicon carbide edge termination region) to the edge 302 of the silicon carbide devices 300, extends to the edge 302 of the silicon carbide device or ends at the same predefined distance to the edge 302 of the silicon carbide device 300 as the buried lateral silicon carbide edge termination region 320. In this example, the buried lateral silicon carbide edge termination region 320 comprises a larger thickness than the silicon carbide surface layer 330.

The edge termination shown in FIG. 3 may comprise one or more optional, additional features corresponding to one or more aspects mentioned above (e.g. FIG. 1A-1G).

Some embodiments relate to a silicon carbide device comprising an n-doping and a buried lateral silicon carbide edge termination region located within the epitaxial silicon carbide layer comprising a p-doping. The buried lateral silicon carbide edge termination region is covered by a silicon carbide surface layer comprising an n-doping. The buried lateral silicon carbide edge termination region comprises a thickness between 600 nm and 800 nm and the silicon carbide surface layer comprises a thickness between 50 nm and 200 nm or between 600 nm and 1 μm.

The silicon carbide device may comprise one or more additional optional features corresponding to one or more aspects described above.

In some embodiments, the silicon carbide device comprises a Schottky diode, a merge pin Schottky diode, a p-n diode, a bipolar transistor, a field effect transistor, a metal oxide semiconductor transistor or a junction gate field effect transistor. In other words, the silicon carbide device may be a Schottky diode, a merge pin Schottky diode, a p-n diode, a bipolar transistor, a field effect transistor, a metal oxide semiconductor transistor or a junction gate field effect transistor or an electrical circuit comprising one or more of these elements.

FIG. 4A-4C show schematic cross-sections of a part of silicon carbide devices according to an embodiment. The implementation of the silicon carbide devices 400 is similar to the implementation shown in FIG. 2B. Additionally, an inorganic passivation layer structure comprising a silicon oxide layer 422 and a silicon nitride layer 424 as well as a molding material layer 430 are arranged on top of the silicon carbide substrate. Further, more than one buried lateral silicon carbide edge termination regions 220 (e.g. representing guard rings) are implemented within the epitaxial silicon carbide layer 210 of the silicon carbide substrate. More details and aspects are described in connection with the embodiments above (e.g. FIGS. 1A-1G and 2B).

FIG. 4A-4C may show regions of differing dopant distribution within the silicon carbide substrate of silicon carbide Schottky diodes with edge termination, for example. In this examples, the edge termination comprises guard rings 220, a cover of a second epitaxial layer 230 and a hard passivation (inorganic passivation layer structure). In this way, a diode with a blocking voltage of 650V, 1200V and/or 1700V may be implemented, for example. Field strengths in the range of 400 kV/cm and below at the surface of the hard passivation can be reached by means of the combined edge termination.

The silicon carbide substrate material 250 may comprises an n-doping with a doping concentration of ~2.7e18 cm$^{-3}$, the epitaxial silicon carbide layer 210 may comprises an n-doping with a doping concentration of ~1e17 cm$^{-3}$, the silicon carbide surface layer 230 may comprises an n-doping with a doping concentration of ~5.6e15 cm$^{-3}$ and the guard rings 220 may comprises an p-doping with a doping concentration of ~−2.2e18 cm$^{-3}$, for example.

FIG. 4A shows an example of an edge termination of a 650V silicon carbide Schottky diode, FIG. 4B shows an example of an edge termination of a 1200V silicon carbide Schottky diode and FIG. 4C shows an example of an edge termination of a 1700V silicon carbide Schottky diode (e.g. edge termination comprises guard rings, second epitaxy Epi2 cover and hard passivation).

Figure 5A:
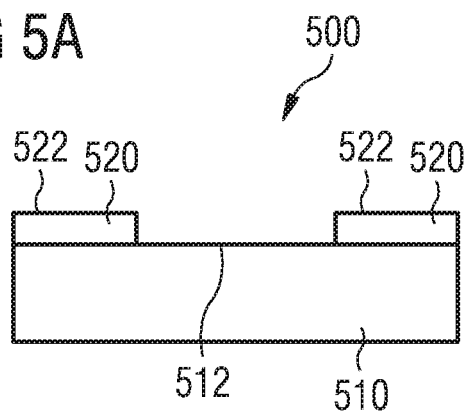
FIG. 5A shows a schematic cross-section of a silicon carbide device.
Figure 5B:
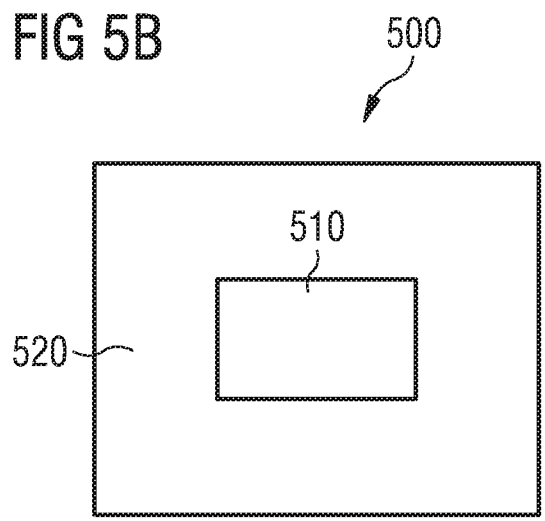
FIG. 5B shows a schematic top view of the silicon carbide device shown in FIG. 5A.

FIGS. 5A and 5B show a schematic illustration of a silicon carbide device 500 according to an embodiment. The silicon carbide device 500 comprises a silicon carbide substrate 510 and an inorganic passivation layer structure 520 laterally covering at least partly a main surface 512 of the silicon carbide substrate 510. The silicon carbide substrate 510 and the inorganic passivation layer 520 are configured so that an electric field at a surface 522 of the inorganic passivation layer structure 520 located opposite to the silicon carbide substrate 510 is lower than 500 kV/cm while at least one region of the silicon carbide substrate 510 comprises at least an electric field of 2.3 MV/cm.

By using an inorganic passivation structure 520 in combination with field reduction measures within the silicon carbide substrate 510, the field at the outer surface 522 of the inorganic passivation structure 520 can be reduced blow 500 kV/cm although a field of at least 2.3 MV/cm occurs within the silicon carbide substrate 510. In this way, a large variety of organic materials beside polyimide with better moisture resistance than polyimide can be used for an additional passivation layer on top of the inorganic passivation structure. Alternatively, a molding material can be implemented adjacent to the inorganic passivation structure 520. In this way, the breakdown behavior and the long-term reliability of the silicon carbide device 500 can be improved.

The surface 512 of the inorganic passivation layer structure 520 located opposite to the silicon carbide substrate 510 may be the surface of the last inorganic material layer towards a molding material covering the silicon carbide die of the silicon carbide device 500. The electric field may be lower than 500 kV/cm throughout at least 50%, at least 80% or the whole surface of the inorganic passivation layer structure 520 located opposite to the silicon carbide substrate 510.

The silicon carbide device 500 may comprise one or more optional additional features described in connection with the mentioned concept or one or more embodiments (e.g. FIG. 1A-1G) described above.

Figure 6:
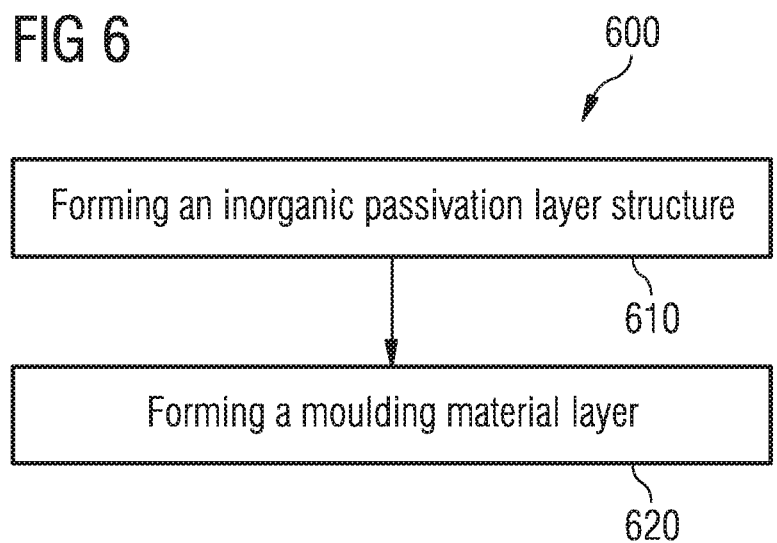
FIG. 6 shows a flowchart of a method for manufacturing a silicon carbide device.

FIG. 6 shows a flowchart of a method 600 for forming a silicon carbide device comprising forming 610 an inorganic passivation layer structure laterally covering at least partly a main surface of a silicon carbide substrate and forming 620 a molding material layer adjacent to the inorganic passivation layer structure.

In this way, a silicon carbide device with improved breakdown behavior and long-term reliability can be provided with low effort.

Further, the method 600 may comprise one or more optional, additional or alternative acts corresponding to one or more aspects mentioned above.

For example, the method 600 may further comprise forming an epitaxial silicon carbide layer of the silicon carbide substrate comprising a first conductivity type and forming a buried lateral silicon carbide edge termination region comprising a second conductivity type and being located within the epitaxial silicon carbide layer. The buried lateral silicon carbide edge termination region is formed so that it is covered by a silicon carbide surface layer comprising the first conductivity type.

In this way, a silicon carbide device with the properties and characteristics mentioned above can be manufactured with low effort.

The buried lateral silicon carbide edge termination region below the silicon carbide surface layer may be manufactured in different ways. For example, the manufacturing of the buried lateral silicon carbide edge termination region may comprise implanting ions of the second conductivity type into the epitaxial silicon carbide layer through a surface region of the epitaxial silicon carbide layer (e.g. through a part of the surface of the silicon carbide device determined by an implant mask used for masking the implant) representing the silicon carbide surface layer so that the buried lateral silicon carbide edge termination region is covered by the silicon carbide surface layer of the epitaxial silicon carbide layer. In other words, the buried lateral silicon carbide edge termination region may be manufactured by a high-energy ion implant into the depth of the epitaxial silicon carbide layer so that a thin epitaxial silicon carbide layer comprising the first conductivity type remains on top of the implant region. This remaining layer forms the silicon carbide surface layer. For example, ions with an average energy of more than 50 keV, more than 100 keV or more than 200 keV may be used for manufacturing the buried lateral silicon carbide edge termination region within the epitaxial silicon carbide layer. Further, the energy distribution of the ions can be selected so that the doping concentration varies with the depth in a predefined manner. For example, the doping concentration may increase with the depth to a maximum and may decrease afterwards. Alternatively, the basically constant doping concentration may be manufactured (e.g. neglecting edge effects and neglecting deviation of less than 20%, 10% or 5%) resulting basically a box or rectangular distribution.

Further, optionally, the thickness of the silicon carbide surface layer can be increased by depositing silicon carbide on the silicon carbide surface layer (e.g. by epitaxy).

Alternatively, the buried lateral silicon carbide edge termination region may be manufactured by implanting ions of the second conductivity type into a surface region of the epitaxial silicon carbide layer so that the buried lateral silicon carbide edge termination layer is exposed at the surface of the epitaxial silicon carbide layer. Further, the silicon carbide surface layer may be deposited epitaxially on top of the epitaxial silicon carbide layer so that the buried lateral silicon carbide edge termination region is covered by the silicon carbide surface layer. In other words, the buried lateral silicon carbide edge termination region may be implanted with low energy ions resulting in an implant area located at or near the surface of the epitaxial silicon carbide layer. Afterwards, the buried lateral silicon carbide edge termination region is buried by depositing the silicon carbide surface layer.

In this way, a smearing of the implanted ions at the edge of the buried lateral silicon carbide edge termination region into the silicon carbide surface layer can be avoided. Further, the silicon carbide surface layer can be implemented with almost arbitrary thickness. Further, the doping concentration of the silicon carbide surface layer can be selected in a wide range and independent of the doping concentration of the epitaxial silicon carbide layer comprising the buried lateral silicon carbide edge termination region.

Alternatively to the deposition of the silicon carbide surface layer on top of the epitaxial silicon carbide layer, ions with the first conductivity type can be implanted with lower energy (e.g. average or maximal energy) than the buried lateral silicon carbide edge termination region so that a thin layer exposed at the surface of the epitaxial silicon carbide layer is converted to the silicon carbide surface layer comprising the first conductivity type. In other words, after implanting ions of the second conductivity type into a deep surface region (e.g. compared to a surface region of the silicon carbide surface layer) of the epitaxial silicon carbide layer, ions of the first conductivity type can be implanted into a shallow surface region (e.g. thinner than the deep surface region of the buried lateral silicon carbide edge termination region) of the epitaxial silicon carbide layer so that the silicon carbide surface layer is obtained on top of the buried lateral silicon carbide edge termination region, wherein the ions are implanted in the shallow surface region with a doping concentration higher than a (e.g. maximal or average) doping concentration of the buried lateral silicon carbide edge termination region in the shallow surface region before the implant of the ions. In this way, a buried edge termination region can be obtained without an additional epitaxial process. Therefore, a reliable edge termination can be obtained with low effort.

Optionally, alternatively or additionally, the doping concentration within the silicon carbide surface layer can be increased by a further implant. In other words, the method 400 may further comprise implanting ions of the first conductivity type into the silicon carbide surface layer so that the silicon carbide surface layer comprises a higher doping concentration than the epitaxial silicon carbide layer. In this way, the doping concentration of the silicon carbide surface layer can be selected in a wide range.

Optionally, alternatively or additionally, the method 400 may further comprise removing the silicon carbide surface layer (e.g. if it is deposited throughout the whole surface of the silicon carbide device) at an active area of the silicon carbide device. In this way, the active area may be accessible for further implants for electrical structures used for the electrical functionality of the silicon carbide device or for connecting one or more areas within the active area of the silicon carbide device to a metal contact or a metal layer above or on top of the silicon carbide die.

The proposed method may be used for manufacturing all kinds of semiconductor devices mentioned above. Consequently, the aspects and details mentioned above are applicable or implementable in connection with the method for manufacturing such a silicon carbide device.

Some embodiments relate to a silicon carbide power device with polyimide-free edge termination. By implementing a combination of a buried edge termination (e.g. thick lightly doped n-layer above a p-edge termination), a multiple guard ring approach and a thick hard passivation layer stack, the maximal occurring electric fields at the surface of the hard passivation can be reduced so that the breakdown resistance of the soft casting compound (e.g. module) or the molding material (e.g. discrete device) is not exceeded. In this case, the implementation of a polyimide passivation can be abstained and the risk of local moisture storage associated with a polyimide passivation can be avoided. Alternatively, other passivation materials may be used, which may comprise a lower breakdown resistance but also a lower water acceptance compared to polyimide. For example, passivation materials compatible with the temperature requirements of the manufacturing process, with high breakdown resistance and low moisture acceptance may be used. Additionally, these materials may be well structurable and adhere sufficiently on silicon carbide and/or power metallization.

According to an aspect, the electrical field strength at the chip surface is reduced by a field minimization at the silicon carbide semiconductor surface and the implementation of an inorganic hard passivation so that an additional polyimide passivation may not be necessary, for example.

Depending on the type of silicon carbide device, as for example a diode, a JFET (junction gate field effect transistor) or a MOSFET (metal oxide semiconductor transistor), different process sequences may be used for implementing the buried edge termination and the hard passivation with low additional processing effort.

For example, the formation of a second epitaxial layer (e.g. ~850 nm) is already included for the manufacturing of a silicon carbide JFET. In this case, the layout may be generated so that the second epitaxial layer remains in the junction termination extension region (JTE) and the JTE implant is already done before the deposition of the second epitaxial layer. The thickness and doping of the second epitaxial layer may be adjusted to the width and the doping of the JTE so that the resulting n-surface channel is depleted and a parasitic leakage current path is avoided, if a blocking voltage is applied, for example.

Alternatively, for a trench MOSFET with deep implanted p-structures for electrical shielding of the bottom of the trench, the deep implantation can also be used for forming the buried p-edge termination. Optionally, a further local n-implant at the surface may be done in order to suppress undesired field peaks in the region of the outer ends of the p-implant (mask angle effect).

Further, for an MPS (merged pin Schottky) or Schottky diode, an additional second epitaxial layer or a deep edge implant may be implemented, for example.

For all types of devices, the hard passivation may be deposited so that the overall thickness is sufficient for reducing the surface field below 400 kV/cm, for example. For example, the hard passivation (inorganic passivation layer structure) may comprise a stack of thick silicon dioxide $SiO_2$ (e.g. 2-4 μm deposited so that the structural edges of the device like edges of the power metal are chamfered or planarized) and a silicon nitride $Si_3N_4$ layer at the surface in order to implement a moisture sealing. The structuring of the hard passivation stack can be implemented dry-chemical or by a combination of dry and wet chemistry (e.g. nitride dry and afterwards oxide wet), for example.

The deposition of the oxide layer may be implemented by a dep-etch-dep (depositing-etching-depositing) process, by a reflow process or by a Sin-On-process (silicon oxide process) in order to close cracks occurring at edges reliably. Afterwards, the silicon nitride is deposited on the planarized surface and is dry or dry/wet chemically etched. If the silicon nitride layer is etched dry chemically and the oxide layer is etched wet chemically, a lateral retraction of the oxide and a tilting of the silicon nitride and consequently a covering of the undoped silicate glass (USG) can be obtained resulting in an additional protection against moisture. A photolithographically structurable material (e.g. photosensitive resist) or a hard mask (e.g. polysilicon) may be used as mask for the dry and wet chemical etching. In the latter case, the polysilicon may be structured by means of a photolithographically structurable material by dry chemical etching. Polysilicon comprises a high selectivity with regard to silicon nitride and USG and may be used for structuring thick hard passivation, for example.

The stack sequence of oxide/nitride may be continued arbitrarily until a maximal etchable stack thickness is reached. For example, a sequence of oxide/nitride/oxide/nitride can be implemented. The layer thicknesses within the stack may be freely selectable and independent from each other, but may be selected depending on the required moisture robustness and the field profile at the surface.

An additional protection against moisture may be obtained, if after the implantation and a bake out act and before the deposition of the first metallization layer, a stack of oven nitride and/or oven oxide (TEOS, Tetraethyl orthosilicate) is deposited in the region of the junction termination extension (JTE). This stack can be structured by dry and wet chemical methods described above. Afterwards, the metallization layers can be deposited followed by the representation of the hard passivation.

Some embodiments relate to an edge termination for silicon carbide devices (SiC devices) by implementing buried junction termination extensions by high-energy ion implantation or n-epitaxy. In this way, an H2O-rugged SiC chip (water rugged silicon carbide device) can be provided. In other words, a moisture-resisting edge termination for silicon carbide power semiconductor devices can be provided, for example.

In comparison to silicon carbide edge terminations which are based on the principle of bipolar junction terminations or variation of lateral doping, a degradation of the p-doped silicon carbide region at the interface to the passivation layer subject to certain conditions (e.g. high moisture or temperature variation) and normal electrical load can be avoided by the described concept. Especially a degradation which occurs by an oxidation of the silicon carbide in the p-doped edge region (anodic oxidation) can be avoided. In this way, the doping amount inserted at the edge for the electric field control can be protected from being consumed (by the oxidation) which may result in a destructive breakdown at voltages below the nominal voltage of the device. Also the risk of a crack formation, a low tightness against water, a critical process compatibility and/or vulnerability to the integration of mobile ions resulting in a breakdown voltage drift as it may occur in connection with oxide or nitride coating can be reduced or avoided by using the proposed concept.

The edge termination of such silicon carbide devices can be configured so that an n-doped region is formed at the surface of the edge termination (e.g. especially in the region, in which an increased electrical field strength occurs) to avoid the mentioned degradation effects.

For example, a possible method is the dimensioning of a bipolar junction termination so that the used p-doped region is buried below the silicon carbide surface. Especially at silicon carbide based devices, this can be implemented by implanting the atoms operative as acceptors with an implant energy that causes an end of range which is located at a sufficient distance to the surface. The proposed scheme can easily be implemented since the dopants possible as acceptors virtually do not diffuse in silicon carbide. In comparison, for example silicon comprises a high diffusion constant for possible acceptor materials.

The implantation energies may lie above 50 keV, above 100 keV or above 200 keV, for example. Also an implementation with several energies and different doses may be possible for such an edge termination to improve the effectivity. For example, the dose may first increase with depth and then decrease again. Alternatively, the dose may also decrease with depth.

An embodiment is shown in FIG. 3. Instead of a bipolar junction termination-edge termination, also a variation of lateral doping edge termination may be used (additionally to the proposed concept) that implements either a continuous decrease of the p-doping or a stepped decrease of the p-doping in the lateral direction. Alternatively, a similar variation of lateral doping can be achieved by manufacturing a plurality of buried lateral silicon carbide edge termination regions (e.g. p-rings, ring-shaped regions, point-shaped, saw-tooth-shaped, wavelike regions).

Further, additional implants with dopants operative as donor may be implemented to increase the near-surface n-doping, which may otherwise be determined by the epitaxial layer required for the device. In this connection, the penetration of the donors may be significantly lower than the penetration of the acceptors due to an appropriate selection of the implantation energy. Alternatively, a thin n-doped epitaxial layer may be deposited on top of the epitaxial silicon carbide wafer used for the specific device which comprises the drift layer doping at the surface, since basically no diffusion may occur under the usual high temperature steps. The thickness and the doping of this epitaxial layer may be assessed so that an appropriate n-doped layer remains between the buried p-doped region and the semiconductor surface to enable the desired avoidance of degradation effects on the one hand and to allow an over-doping of the p-regions in the active area of the chip to be realized later on (used for implementing the main electrical functionality of the silicon carbide device) on the other hand. Optionally, this additional epitaxial layer in the active region of the chip can be etched back so that it only remains in the edge region.

In embodiments, the n-doped surface layer may be assessed so that the charge carriers of these layers are at least locally cleared in so far as the resulting cross-conductivity of this layer contributes only a negligible leakage current in a cutoff case or cutoff state of the silicon carbide device.

The proposed edge termination may be based on a p-doped region buried within an n-doped silicon carbide semiconductor. In this way, corresponding structures as well as corresponding methods (for manufacturing) can be implemented. Such structures may avoid that p-doped silicon carbide is a surface part directly exposed to possible oxidation in the region of high surface field strengths.

Embodiments may further provide a computer program having a program code for performing one of the above methods, when the computer program is executed on a computer or processor. A person of skill in the art would readily recognize that steps of various above-described methods may be performed by programmed computers. Herein, some embodiments are also intended to cover program storage devices, e.g., digital data storage media, which are ma-chine or computer readable and encode machine-executable or computer-executable programs of instructions, wherein said instructions perform some or all of the steps of said above-described methods. The program storage devices may be, e.g., digital memories, magnetic storage media such as magnetic disks and magnetic tapes, hard drives, or optically readable digital data storage media. The embodiments are also intended to cover computers programmed to perform said steps of the above-described methods or (field) programmable logic arrays ((F)PLAs) or (field) programmable gate arrays ((F)PGAs), programmed to perform said steps of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is adapted for performing a certain function, respectively. Hence, a "means for s.th." may as well be understood as a "means being adapted or suited for s.th.". A means being adapted for performing a certain function does, hence, not imply that such means necessarily is performing said function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons. Furthermore, in some embodiments a single step may include or may be broken into multiple sub steps. Such sub steps may be included and part of the disclosure of this single step unless explicitly excluded.

What is claimed is:

1. A silicon carbide device comprising:
 a silicon carbide substrate, wherein the silicon carbide substrate comprises an epitaxial silicon carbide layer having a first conductivity type and a buried lateral silicon carbide edge termination region located within the epitaxial silicon carbide layer, wherein the buried lateral silicon carbide edge termination region has a second conductivity type, wherein the buried lateral silicon carbide edge termination region is covered by a silicon carbide surface layer comprising the first conductivity type;
 an inorganic passivation layer structure laterally covering at least partly a main surface of the silicon carbide substrate; and
 a molding material layer adjacent to the inorganic passivation layer structure.

2. The silicon carbide device according to claim 1, wherein the silicon carbide substrate and the inorganic passivation layer structure are configured so that an electric field at a surface of the inorganic passivation layer structure in contact with the molding material layer is lower than 500 kV/cm in an active-state of the silicon carbide device.

3. The silicon carbide device according to claim 2, wherein the silicon carbide substrate is configured to comprise at least at one region at least an electric field of 2.3 MV/cm in an active-state of the silicon carbide device.

4. The silicon carbide device according to claim 1, wherein the molding material layer extends at least along the whole main surface of the silicon carbide substrate.

5. The silicon carbide device according to claim 1, wherein the molding material layer comprises at least mainly at least one of epoxy resin, silica or silica gel.

6. The silicon carbide device according to claim 1, wherein the molding material layer is arranged adjacent to the inorganic passivation layer structure without polyimide material in between.

7. The silicon carbide device according to claim 1, wherein the inorganic passivation layer structure comprises at least one interrupted area, wherein the main surface of the silicon carbide substrate is uncovered by the inorganic passivation layer structure within the interrupted area of the inorganic passivation layer structure, wherein the molding material layer extends through the interrupted area of the inorganic passivation layer structure.

8. The silicon carbide device according to claim 1, wherein the inorganic passivation layer structure comprises at least a first layer and a second layer, wherein the first layer comprises at least mainly silicon oxide and the second layer comprises at least mainly silicon nitride.

9. The silicon carbide device according to claim 7, wherein the second layer is arranged adjacent to the molding material layer.

10. The silicon carbide device according to claim 1, wherein the silicon carbide substrate comprises an edge region surrounding an active area of the silicon carbide substrate at an edge of the silicon carbide substrate, wherein the inorganic passivation layer structure is arranged in contact with the silicon carbide substrate and the molding material layer at least within the edge region.

11. The silicon carbide device according to claim 1, wherein the silicon carbide substrate comprises an edge region surrounding an active area of the silicon carbide substrate at an edge of the silicon carbide substrate, wherein the silicon carbide substrate comprises an epitaxial silicon carbide layer having mainly a first conductivity type and at least one edge termination region located within the edge region surrounding the active area of the silicon carbide substrate, wherein the edge termination region has a second conductivity type.

12. The silicon carbide device according to claim 1, wherein the silicon carbide surface layer comprises a thickness and a doping concentration, so that the depletion zone of the p-n-junction between the buried lateral silicon carbide edge termination region and the silicon carbide surface layer extends at least at one point up to the surface of the silicon carbide surface layer opposite to the buried lateral silicon carbide edge termination region at least in a predefined state of the silicon carbide device.

13. The silicon carbide device according to claim 1, wherein the silicon carbide surface layer is part of the epitaxial silicon carbide layer, wherein the buried lateral silicon carbide edge termination region is an implant region manufactured by implanting ions of the second conductivity type into the epitaxial silicon carbide layer through a surface region of the epitaxial silicon carbide layer representing the silicon carbide surface layer.

14. The silicon carbide device according to claim 1, wherein the silicon carbide surface layer is an epitaxial layer deposited on top of the epitaxial silicon carbide layer comprising the buried lateral silicon carbide edge termination region.

15. The silicon carbide device according to claim 1, wherein the silicon carbide surface layer extends laterally from a lateral end of the buried lateral silicon carbide edge termination region close to the edge of the silicon carbide device to an active area of the silicon carbide device, while the active area is left out by the silicon carbide surface layer.

16. A method for forming a silicon carbide device, the method comprising:
forming a buried lateral silicon carbide edge termination region comprising a second conductivity type within an epitaxial silicon carbide layer of the silicon carbide substrate comprising a first conductivity type, wherein the buried lateral silicon carbide edge termination region is formed, so that it is covered by a silicon carbide surface layer comprising the first conductivity type;
forming an inorganic passivation layer structure laterally covering at least partly a main surface of a silicon carbide substrate; and
forming a molding material layer adjacent to the inorganic passivation layer structure.

* * * * *